(12) United States Patent
Ding et al.

(10) Patent No.: US 9,596,786 B2
(45) Date of Patent: Mar. 14, 2017

(54) CLOSED CIRCULATING WATER COOLING APPARATUS AND METHOD

(75) Inventors: Yigong Ding, Beijing (CN); Weizheng Yao, Xuchang (CN); Jian Zhang, Xuchang (CN); Weihua Ruan, Xuchang (CN); Dawei Wang, Xuchang (CN)

(73) Assignees: STATE GRID CORPORATION OF CHINA, Beijing (CN); XUCHANG XUJI JING RUI SCIENCE & TECHNOLOGY CO., LTD., Xuchang, Henan (CN)

( * ) Notice: Subject to any disclaimer, the term of this patent is extended or adjusted under 35 U.S.C. 154(b) by 224 days.

(21) Appl. No.: 14/361,858

(22) PCT Filed: May 29, 2012

(86) PCT No.: PCT/CN2012/076189
§ 371 (c)(1),
(2), (4) Date: Nov. 13, 2014

(87) PCT Pub. No.: WO2013/078844
PCT Pub. Date: Jun. 6, 2013

(65) Prior Publication Data
US 2015/0237766 A1   Aug. 20, 2015

(30) Foreign Application Priority Data
Dec. 1, 2011   (CN) .......................... 2011 1 0393314

(51) Int. Cl.
*H05K 7/20* (2006.01)
*F25D 3/02* (2006.01)
(Continued)

(52) U.S. Cl.
CPC .......... *H05K 7/20254* (2013.01); *F25D 3/02* (2013.01); *F25D 17/02* (2013.01); *F25D 31/002* (2013.01); *H05K 7/20281* (2013.01)

(58) Field of Classification Search
CPC ............ H05K 7/20254; H05K 7/20281; F25D 31/002; F25D 3/02; F25D 17/02
See application file for complete search history.

(56) References Cited

U.S. PATENT DOCUMENTS 5,970,729 A * 10/1999 Yamamoto .............. F25D 16/00
165/80.4
2010/0071881 A1   3/2010 Murer et al.

FOREIGN PATENT DOCUMENTS

CN    2294433 Y    10/1998
CN    2561099 Y    7/2003
(Continued)

OTHER PUBLICATIONS

International Search Report Corresponding to International Application No. PCT/CN2012/076186; Date of Mailing: Sep. 6, 2012; 6 Pages.

(Continued)

*Primary Examiner* — Emmanuel Duke
(74) *Attorney, Agent, or Firm* — Myers Bigel, P.A.

(57) ABSTRACT

A closed circulating water cooling apparatus and method. The cooling apparatus comprises: an internal cooling apparatus, a plate heat exchanger, an ice thermal-storage auxiliary cooling apparatus. The internal cooling apparatus comprises an air cooler. The ice thermal-storage auxiliary cooling apparatus comprises an ice thermal-storage apparatus.

10 Claims, 3 Drawing Sheets

(51) Int. Cl.
*F25D 17/02* (2006.01)
*F25D 31/00* (2006.01)

(56) References Cited

FOREIGN PATENT DOCUMENTS

| | | | |
|---|---|---|---|
| CN | 1632430 A | | 6/2005 |
| CN | 1891994 A | | 1/2007 |
| CN | 201043863 Y | | 4/2008 |
| CN | 201053795 Y | | 4/2008 |
| CN | 101473709 A | | 7/2009 |
| CN | 201352745 Y | | 11/2009 |
| CN | 101694357 A | | 4/2010 |
| CN | 201491453 U | | 5/2010 |
| CN | 201774788 U | | 3/2011 |
| CN | 201804282 U | * | 4/2011 |
| CN | 201852343 U | | 6/2011 |
| CN | 201878485 U | | 6/2011 |
| CN | 102368615 A | | 3/2012 |
| CN | 102435032 A | | 5/2012 |
| CN | 102435033 A | | 5/2012 |
| CN | 202403477 U | | 8/2012 |
| JP | S54146444 A | | 11/1979 |
| JP | S59119750 A | | 7/1984 |
| JP | S6373879 A | | 4/1988 |
| JP | H05136587 A | | 6/1993 |
| JP | H07218075 A | | 8/1995 |
| JP | 2001010595 A | | 1/2001 |

OTHER PUBLICATIONS

International Search Report Corresponding to International Application No. PCT/CN2012/076187; Date of Mailing: Sep. 6, 2012; 8 Pages.
International Search Report Corresponding to International Application No. PCT/CN2012/076189; Date of Mailing: Sep. 27, 2012; 8 Pages.
Decision to Grant, Chinese Patent Application No. 201110393314.9, Feb. 27, 2014, 2 pages.
Chinese Office Action Corresponding to Chinese Patent Application No. 201110393314.9; Date Mailed: Aug. 19, 2013; Foreign Text, 8 Pages.
Chinese Office Action Corresponding to Chinese Patent Application No. 201110393314.9; Date Mailed: Dec. 31, 2012; Foreign Text, 6 Pages.
Office Action for corresponding ARIPO patent application No. AP/P/2014/007682 mailed Jun. 24, 2016, 5 pages.

* cited by examiner

CLOSED CIRCULATING WATER COOLING APPARATUS AND METHOD

RELATED APPLICATIONS

The present application is a 35 U.S.C. §371 national phase application of PCT International Application No. PCT/CN2012/076189, filed May 29, 2012, which claims priority from Chinese Patent Application No. 201110393314.9, filed Dec. 1, 2011, the disclosures of which are hereby incorporated herein by reference in their entireties. PCT International Application No. PCT/CN2012/076189 is published as PCT Publication No. WO 2013/078844 A1.

TECHNICAL FIELD

The present invention relates to the field of cooling apparatus, and more particularly to a closed circulating water cooling apparatus and a method thereof in which cooling water flowing through an air cooler is re-cooled by a plate heat exchanger.

BACKGROUND

Nowadays, many power stations and power transmission stations such as converter stations are established in dry and water-shortage regions of North China, where due to high environment temperature and significant water evaporation in summer, water resources are more precious. However, if equipments of power stations and power transmission stations such as converter stations are cooled with traditional water cooling methods, the scarce water resources in those regions may be exhausted. Thus, all of the cooling equipments generally used in these power stations utilize air coolers. Because converter stations are always located in geographical positions having relatively lower environment temperature, the utilization of air coolers may meet the cooling requirement of a converter valve, which is a kind of processing equipment used in power stations, and the satisfied cooling effects may be achieved.

However, some regions have such high temperature that the air coolers cannot cool the fluid to environment temperature, thereby limiting the application of the air coolers in such dry regions. For example, in some places in Northwest China, the highest extreme environment temperature may come up to 44° C., while the highest inlet valve temperature that is permitted by a converter valve as a core equipment of DC transmission projects is only 40° C. In this situation, pure water used for the converter valve cannot be cooled by the air coolers. On the contrary, the air coolers may heat the cooling water. Thus, it is not suitable to only adapt air coolers in this situation.

Also, because power generation and power transmission equipments generally enter maximum operating conditions in the hottest days in summer when environment temperature reaches its highest extreme value, the air coolers may usually not provide enough cooling capability in this case. As a result, the converter stations have to operate with reduced payloads, as well as lowered power levels, which may cause significant economic loss and an adverse effect on the development of national economy.

SUMMARY

In view of this, a technical problem to be solved by the invention is to provide a cooling apparatus and improve the cooling capability thereof.

A closed circulating water cooling apparatus comprises an internal cooling apparatus, a plate heat exchanger 7 and an ice thermal-storage auxiliary cooling apparatus, wherein the internal cooling apparatus comprises an internal cooling circulation pump 2 and an air cooler 3; the ice thermal-storage auxiliary cooling apparatus comprises an external cooling circulation pump 8 and an ice thermal-storage apparatus 9, wherein heat is exchanged between internal cooling water in the internal cooling apparatus flowing through the plate heat exchanger 7 and external cooling water in the ice thermal-storage auxiliary cooling apparatus flowing through the plate heat exchanger 7.

According to an apparatus embodiment of this invention, the internal cooling apparatus further comprises a first loop valve 4 and second loop valves 5, 6; in the state that the first loop valve 4 is opened and the second loop valves 5, 6 are closed, the air cooler 3 and a device to be cooled 1 form a first loop in which the internal cooling water circulates; in a state that the first loop valve 4 is closed and the second loop valves 5, 6 are opened, the device to be cooled 1, the air cooler 3 and the plate heat exchanger 7 form a second loop in which the internal cooling water circulates.

According to an apparatus embodiment of this invention, when the environment temperature is lower than a temperature threshold $T_1$, the ice thermal-storage auxiliary cooling apparatus stops operation and the internal cooling water circulates in the first loop, wherein the internal cooling water is cooled when passing through the air cooler 3, and then is further used to cool the device to be cooled 1; when the environment temperature is higher than $T_1$ but lower than a temperature threshold $T_2$, the first loop valve 4 is closed and the second loop valves 5, 6 are opened, the internal cooling water circulates in the second loop, wherein the internal cooling water is cooled by the external cooling water when passing through the plate heat exchanger 7, and then is further used to cool the device to be cooled 1; the ice thermal-storage apparatus 9 operates and makes cooling-storage at night; when the environment temperature is higher than $T_2$ and lower than a temperature threshold $T_3$, the first loop valve 4 is closed and the second loop valves 5, 6 are opened, the internal water circulates in the second loop, wherein the internal cooling water is cooled when passing through the air cooler 3, and then is further cooled by the external cooling water when passing through the plate heat exchanger 7, and the further cooled internal cooling water is used to cool the device to be cooled 1; the ice thermal-storage apparatus (9) operates and makes cooling-storage at night; where $T_1$ is less than $T_2$ and $T_2$ is less than $T_3$.

According to an apparatus embodiment of this invention, the internal cooling apparatus further comprises a water temperature sensor and/or an environment temperature sensor, and a control unit for controlling opening and closing of the first loop valve 4 and the second loop valves 5, 6 according to a water temperature of the internal cooling water that is measured by the water temperature sensor and/or an environment temperature that is measured by the environment temperature sensor.

According to an apparatus embodiment of this invention, the internal cooling circulation pump 2 and the external cooling circulation pump 8 are in a primary-auxiliary redundancy configuration.

According to an apparatus embodiment of this invention, the internal cooling circulation pump 2 and the external cooling circulation pump 8 are in a primary-auxiliary redundancy configuration.

According to an apparatus embodiment of this invention, the device to be cooled 1 is a converter valve provided in a DC power transmission equipment.

The cooling apparatus of this invention adopts an cooling-storage conditioning equipment in connection with a plate heat exchanger to re-cool internal cooling water passing through an air cooler, so as to improve cooling capability of the cooling apparatus. A problem that the air cooler cannot cool the fluid to environment temperature and below environment temperature may be solved. Further, because no water is lost during the operation of the device, a purpose of water saving may be achieved.

A technical problem to be solved by this invention is to provide a cooling method to improve cooling capability of a cooling apparatus.

A closed circulating water cooling method comprises: cooling a device to be cooled 1 with internal cooling water in an internal cooling apparatus, the internal cooling water passing through a plate heat exchanger 6 and exchanging heat with external cooling water in an ice thermal-storage auxiliary cooling apparatus flowing through the plate heat exchanger 6, wherein the internal cooling apparatus comprises an internal cooling circulation pump 2 and an air cooler 3; the ice thermal-storage auxiliary cooling apparatus comprises an external cooling circulation pump 8 and an ice thermal-storage apparatus 9.

According to a method embodiment of this invention, opening a first loop valve 4 and closing second loop valves 5, 6, the air cooler 3 and the device to be cooled 1 forming a first loop in which the internal cooling water circulates; closing the first loop valve 4 and opening the second loop valves 5, 6, the device to be cooled 1, the air cooler 3 and the plate heat exchanger 7 forming a second loop in which the internal cooling water circulates; the plate heat exchanger 7 and the ice thermal-storage apparatus 9 forming a circulation loop for external cooling circulation water, and the external cooling water circulating in the circulation loop for the external cooling circulation water.

According to a method embodiment of this invention, when the environment temperature is lower than a temperature threshold $T_1$, the ice thermal-storage auxiliary cooling apparatus stops operation and the internal cooling water circulates in the first loop, wherein the internal cooling water is cooled when passing through the air cooler 3, and then is further used to cool the device to be cooled 1; when the environment temperature is higher than $T_1$ and lower than a temperature threshold $T_2$, the first loop valve 4 is closed and the second loop valves 5, 6 are opened, the internal cooling water circulates in the second loop, wherein the internal cooling water is cooled by the external cooling water when passing through the plate heat exchanger 7, and then is further used to cool the device to be cooled 1; the ice thermal-storage apparatus 9 operates and makes cooling-storage at night; when the environment temperature is higher than $T_2$ and lower than a temperature threshold $T_3$, the first loop valve 4 is closed and the second loop valves 5, 6 are opened, the internal water circulates in the second loop, wherein the internal cooling water is cooled when passing through the air cooler 3, and then is further cooled by the external cooling water when passing through the plate heat exchanger 7, and the further cooled internal cooling water is used to cool the device to be cooled 1; the ice thermal-storage apparatus 9 operates and makes cooling-storage at night; where $T_1$ is less than $T_2$ and $T_2$ is less than $T_3$.

According to a method embodiment of this invention, the internal cooling apparatus is further provided with a water temperature sensor and/or an environment temperature sensor, and a control unit controls opening and closing of the first loop valve 4 and the second loop valves 5, 6 according to a water temperature of the internal cooling water that is measured by the water temperature sensor and/or an environment temperature that is measured by the environment temperature sensor.

According to a method embodiment of this invention, the internal cooling circulation pump 2 and the external cooling circulation pump 8 are in a master-slave configuration.

According to a method embodiment of this invention, the device to be cooled 1 is a converter valve provided in a DC power transmission equipment.

The method of this invention adopts an cooling-storage conditioning equipment in connection with a plate heat exchanger to re-cool internal cooling water passing through an air cooler, so as to improve cooling capability of the cooling apparatus. A problem that the air cooler cannot cool the fluid to environment temperature and below environment temperature may be solved. Further, because no water is lost during the operation of the device, a purpose of water saving may be achieved.

BRIEF DESCRIPTION OF THE DRAWINGS

The accompanying drawings, which constitute a part of the specification, provide a further understanding of this invention. Exemplary embodiments of this invention and their illustrations are given for the purpose of illustrating the invention, which are not limiting the invention, in the figures.

DETAILED DESCRIPTION OF THE PREFERRED EMBODIMENT

The cooling apparatus and method of this invention adopts an cooling-storage conditioning equipment in connection with a plate heat exchanger to re-cool internal cooling water passing through an air cooler, so as to improve cooling capability of the cooling apparatus.

A description of the technical solution of this invention will be given in terms of many aspects below with reference to the drawings and embodiments.

Figure 1:
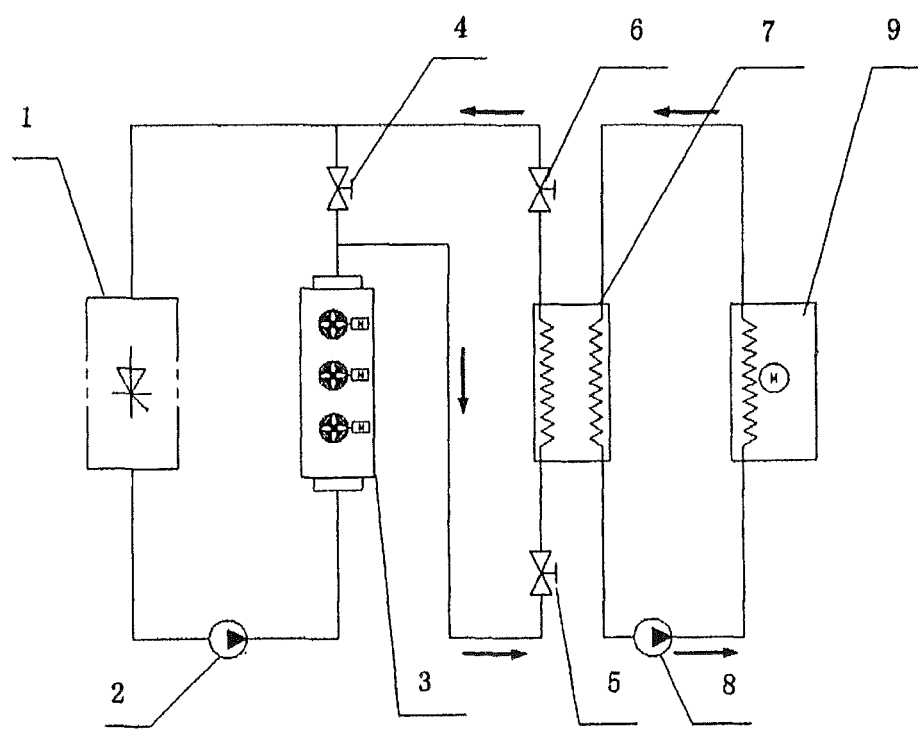
FIG. 1 is a schematic diagram of one embodiment of the cooling apparatus according to this invention.

FIG. 1 is a schematic diagram of one embodiment of the cooling apparatus according to this invention. As shown in FIG. 1, the internal cooling apparatus comprises: an internal cooling circulation pump 2, an air cooler 3, a first loop valve 4, two second loop valves 5 and 6; the auxiliary cooling apparatus comprises: an external cooling circulation pump 8 and an ice thermal-storage apparatus 9. A loop is formed by the air cooler 3 and the device to be cooled 1 when the first loop valve 4 is opened and the second loop valves 5, 6 are closed. Internal cooling water is powered by the internal cooling circulation pump 2 to circulate in the loop, wherein the internal cooling water is cooled when passing through the air cooler 3 and then is used to cool the device to be cooled 1.

A loop is formed by the device to be cooled 1, the air cooler 3 and the plate heat exchanger 7 when the first loop valve 4 is closed, and the second loop valves 5, 6 are opened.

Internal cooling water is powered by the internal cooling circulation pump 2 to circulate in the loop, wherein the internal cooling water is cooled when passing through the air cooler 3, which is further cooled when entering the plate heat exchanger 7 and then is used to cool the device to be cooled 1.

External cooling circulation water is powered by the external cooling circulation pump 8 to circulate in a loop formed by the plate heat exchanger 7 and the ice thermal-storage apparatus 9, wherein the ice thermal-storage apparatus 9 is used to cool the external cooling circulation water.

According to one embodiment of this invention, there may be one second loop valve provided at the outlet or inlet of the plate heat exchanger 7. There may be two second loop valves provided at the outlet and inlet of the plate heat exchanger 7, respectively.

According to one embodiment of this invention, the ice thermal-storage apparatus 9 makes and stores cooling with electrical cooling technology. The device to be cooled 1 is a converter valve provided in a DC power transmission equipment, and the internal cooling water is pure water.

According to one embodiment of this invention, the internal cooling water is heated by the converter valve and then is driven by the internal cooling circulation pump 2 to pass through the plate heat exchanger 7, where the internal cooling water is cooled. The cooled internal cooling water is driven by the internal cooling circulation pump 2 so as to be transported to the converter valve again, and circulates in cycles in this manner.

In the case of a relatively higher environment temperature, the first loop valve 4 is closed and the two second loop valves 5 and 6 are opened. Internal cooling water having some heat dissipated by the air cooler is further cooled by the plate heat exchanger 7 to be within a temperature range permitted by the industry equipment. The plate heat exchanger 7 adopts the ice thermal-storage apparatus 9 to dissipate the collected heat.

According to one embodiment of this invention, the first loop valve 4 and the second loop valves 5, 6 may be automatic or manual valves.

The internal cooling apparatus further comprises a control unit which is not shown in FIG. 1. When the temperature of the internal cooling water is higher than a threshold or the environment temperature is higher than a threshold, the control unit closes the first loop valve 4 and opens the second loop valves 5, 6. The internal cooling apparatus is provided with a water temperature sensor and/or an environment temperature sensor for measuring water temperature of the internal cooling water and environment temperature.

According to one embodiment of this invention, the internal cooling circulation pump 2 and the external cooling circulation pump 8 may be in a primary-auxiliary redundancy configuration to improve the operation security and reliability of the cooling apparatus.

Figure 2:
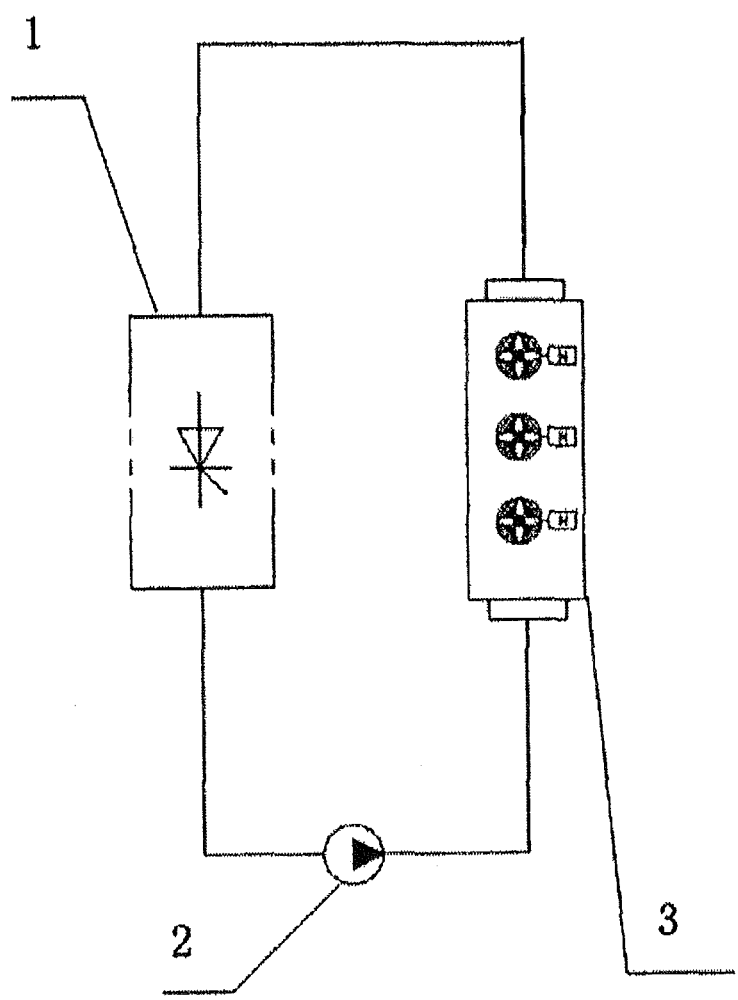
FIG. 2 is a schematic diagram of one operating state of one embodiment of the cooling apparatus according to this invention.

FIG. 2 is a schematic diagram of one operating state of one embodiment of the cooling apparatus according to this invention. As shown in FIG. 2, the internal cooling apparatus comprises: an internal cooling circulation pump 2, an air cooler 3, wherein a loop is formed by the device to be cooled 1 and the air cooler 3. The internal cooling water is powered by the internal cooling circulation pump 2 to circulate in the loop, wherein the internal cooling water is cooled when passing through the air cooler 3 and then is used to cool the device to be cooled 1. The internal cooling water circulates in cycles in this manner.

Figure 3:
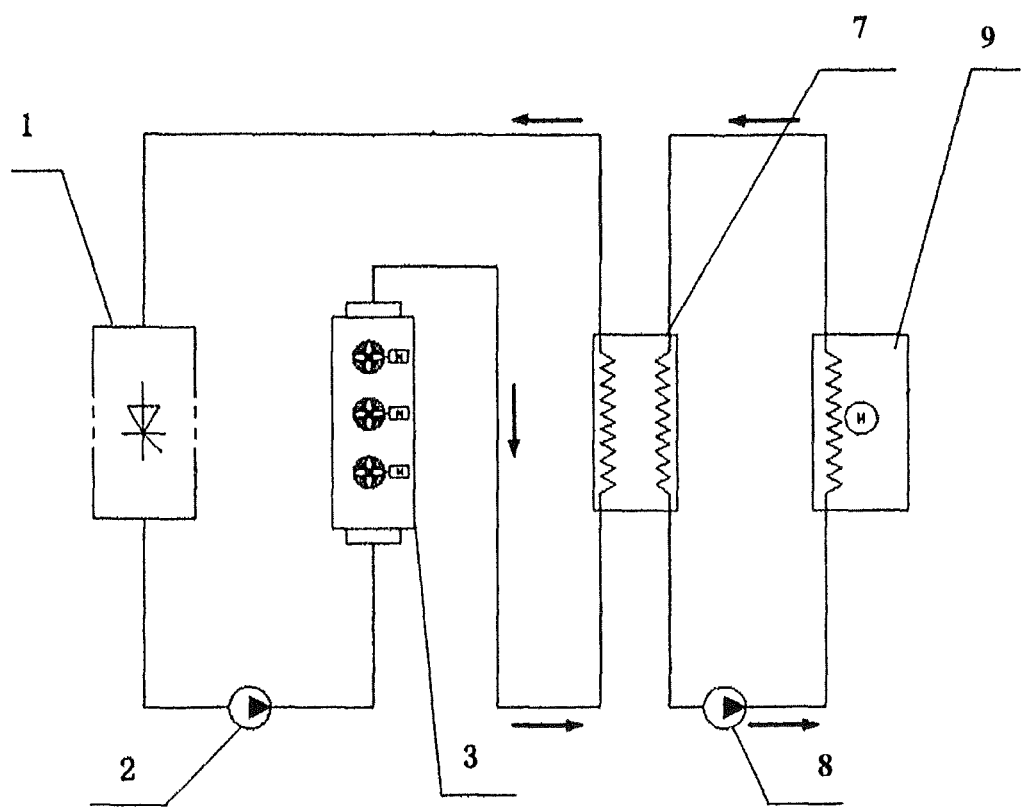
FIG. 3 is a schematic diagram of another operating state of one embodiment of the cooling apparatus according to this invention.

FIG. 3 is a schematic diagram of another operating state of one embodiment of the cooling apparatus according to this invention. As shown in FIG. 3, the internal cooling apparatus comprises: an internal cooling circulation pump 2, an air cooler 3; the auxiliary cooling apparatus comprises: an external cooling circulation pump 8 and an ice thermal-storage apparatus 9, wherein external cooling circulation water is powered by the external cooling circulation pump 8 to circulate in a loop formed by the plate heat exchanger 7 and the ice thermal-storage apparatus 9, wherein the ice thermal-storage apparatus 9 is used to cool the external cooling circulation water.

A loop is formed by the device to be cooled 1, the air cooler 3 and the plate heat exchanger 7. Internal cooling water is powered by the internal cooling circulation pump 2 to circulate in the loop, wherein the internal cooling water is cooled when passing through the air cooler 3, which is further cooled when entering the plate heat exchanger 7 and then is used to cool the device to be cooled 1. Heat is exchanged between the internal cooling water flowing through the plate heat exchanger 7 and the external cooling water flowing through the plate heat exchanger 7, and the internal cooling water circulates in cycles in this manner.

It can be seen from the content described above, all of the water closely circulates within the interior of the equipment without any loss or waste of water, showing a characteristic of no-water-loss.

According to one embodiment of this invention, when the environment temperature is lower than a temperature threshold $T_1$, wherein the value of $T_1$ is determined depending on the design capacity of the air cooler 3, which is generally from $-5°$ C. to $25°$ C., the air cooler 3 is sufficient to satisfy the requirement for cooling capacity. In this mode, the ice thermal-storage auxiliary cooling apparatus stops operation, the first loop valve 4 is opened, and the second loop valves 5 and 6 are closed, so that the air cooler 3 and the device to be cooled 1 form a first loop in which the internal cooling water circulates. The internal cooling water is cooled when passing through the air cooler 3 and then is used to cool the device to be cooled 1. The internal cooling circulation pump 2 is in its operating state. In such an operating mode, the maximum energy consumption of a typical set of cooling system is that when $2/3$ of the fans of the air cooler 3 operate at their full speed (i.e., its maximum energy consumption is 176 kW in this mode).

When the environment temperature is higher than $T_1$ but lower than a temperature threshold $T_2$, the temperature value $T_1$ is the same as that in the above mode, and $T_2$ is determined based on the design margin of the air cooler, and the larger the margin is, the higher the temperature $T_2$ is. In general, the value $T_2$ is less than the highest extreme environment temperature by approximately $3°$ C. to $8°$ C. ($T_2$ is generally $30°$ C. to $38°$ C.). In this mode, the ice thermal-storage apparatus starts and makes cooling-storage at night, and in the daytime the plate heat exchanger uses the cooling stored at night to absorb heat. The first loop valve 4 is closed and the second loop valves 5, 6 are opened, so that the device to be cooled 1, the air cooler 3 and the plate heat exchanger 7 form a second loop in which the internal cooling water circulates. The internal cooling water passes through the plate heat exchanger 7 and is cooled by the external cooling water, and then is used to cool the device to be cooled 1. The ice thermal-storage apparatus 9 operates and make cooling-storage at night. The air cooler 3 may or may not operate. If the temperature at night drops below the temperature threshold $T_1$, the first loop valve 4 is opened, and the second loop valves 5 and 6 are closed, so that the air cooler 3 and the device to be cooled 1 form a loop in which the internal cooling water circulates. In such an operating mode, the maximum energy consumption of the external cooling equipment of a typical set of converter valve cooling system is approximately equal to that when ⅔ of the fans of the air cooler operate at their full speed.

When the environment temperature is higher than $T_2$ but lower than a temperature threshold $T_3$, the temperature value $T_2$ is the same as that in the above mode, T3 is the highest extreme environment temperature, which is generally 38° C. to 45° C. In this mode, it is necessary to start the cooling-storage air conditioning equipment to make cooling-storage at night, and in the daytime the plate heat exchanger uses the stored cooling to absorb heat. The air cooler 3 substantially operates at full speed in the daytime, and the plate heat exchanger and the external cooling primary circulation pump are also in their operating state. The first loop valve 4 is closed and the second loop valves 5, 6 are opened, so that the device to be cooled 1, the air cooler 3 and the plate heat exchanger 7 form a second loop in which the internal cooling water circulates. The internal cooling water is cooled when passing through the air cooler 3 and is further cooled by the external cooling water when passing through the plate heat exchanger 7, and the further cooled internal cooling water is used to cool the device to be cooled 1. The ice thermal-storage apparatus 9 operates and makes cooling-storage at night. In such an operating mode, the maximum energy consumption of a set of cooling system is generally 319 kW.

The cooling apparatus and method of this invention may solve the problem that the air cooler cannot cool the fluid to the environment temperature and below the environment temperature. When the environment temperature is higher than or equal to a maximum inlet water temperature that is permitted by the process equipment, the cooling water may not be cooled by the air cooler at a time. On the contrary, the air cooler may heat the cooling water. The cooling apparatus of this invention still has sufficient cooling capability to satisfy the operation requirement of the process equipment. There is no water loss during the operation of the cooling apparatus of the invention, so that a purpose of water saving may be achieved, and the shortcoming of heavy water consumption caused by cooling towers may be overcome. The cooling-storage air conditioning equipment is used to make cooling-storage at night when the cooling apparatus has smaller energy consumption, and in the daytime, the stored cooling is used to absorb heat, so that power loads may be distributed evenly. Further, different operating modes may be selected depending on different environment temperatures to guarantee minimum energy consumption of the apparatus.

At last it should be noticed that the above embodiments are given for the purpose of illustrating the technical solution of this invention, and are not limitation thereof. Although this invention has been described in detail according to preferable embodiments, those skilled in the art may understand that modifications and substitutions may be made to some technical features of those specific embodiments without departing from the spirit of this invention, which therefore should be encompassed in the scope claimed by this invention.

What is claimed is:

1. A closed circulating water cooling apparatus, comprising:
    an internal cooling apparatus, a plate heat exchanger and an ice thermal-storage auxiliary cooling apparatus, wherein the internal cooling apparatus comprises an internal cooling circulation pump and an air cooler;
    the ice thermal-storage auxiliary cooling apparatus comprises an external cooling circulation pump and an ice thermal-storage apparatus, wherein heat is exchanged between internal cooling water in the internal cooling apparatus flowing through the plate heat exchanger and external cooling water in the ice thermal-storage auxiliary cooling apparatus flowing through the plate heat exchanger),
    wherein the internal cooling apparatus further comprises a first loop valve and second loop valves; in the state that the first loop valve is opened and the second loop valves are closed, the air cooler and a device to be cooled form a first loop in which the internal cooling water circulates; in a state that the first loop valve is closed and the second loop valves are opened, the device to be cooled, the air cooler and the plate heat exchanger form a second loop in which the internal cooling water circulates; a circulation loop of the external cooling water is formed by the plate heat exchanger and the ice thermal-storage apparatus.

2. The apparatus according to claim 1, wherein an environment temperature is compared with temperature thresholds $T_1$, $T_2$ and $T_3$, respectively, wherein the temperature threshold $T_1$ is determined depending on a design capacity of the air cooler, the temperature threshold $T_2$ is determined based on a design margin of the air cooler, the temperature threshold T3 is the highest extreme environment temperature, $T_1$ is less than $T_2$ and $T_2$ is less than $T_3$, when the environment temperature is lower than the temperature threshold $T_1$, the ice thermal-storage auxiliary cooling apparatus stops operation and the internal cooling water circulates in the first loop, wherein the internal cooling water is cooled when passing through the air cooler, and then is further used to cool the device to be cooled;
    when the environment temperature is higher than $T_1$ but lower than the temperature threshold $T_2$, the first loop valve is closed and the second loop valves are opened, the internal cooling water circulates in the second loop, wherein the internal cooling water is cooled by the external cooling water when passing through the plate heat exchanger, and then is further used to cool the device to be cooled;
    the ice thermal-storage apparatus operates and makes cooling-storage at night; when the environment temperature is higher than $T_2$ and lower than the temperature threshold $T_3$, the first loop valve is closed and the second loop valves are opened, the internal water circulates in the second loop, wherein the internal cooling water is cooled when passing through the air cooler, and then is further cooled by the external cooling water when passing through the plate heat exchanger, and the internal cooling water is used to cool the device to be cooled;
    the ice thermal-storage apparatus operates and makes cooling-storage at night.

3. The apparatus according to claim 1, wherein opening and closing of the first loop valve and the second loop valves are controlled according to a water temperature of the internal cooling water and/or an environment temperature.

4. The apparatus according to claim 1, wherein the internal cooling circulation pump and the external cooling circulation pump are in a primary-auxiliary redundancy configuration.

5. The apparatus according to claim 2, wherein the device to be cooled is a converter valve provided in a DC power transmission equipment.

6. A closed circulating water cooling method, comprising:
cooling a device to be cooled with internal cooling water in an internal cooling apparatus, the internal cooling water passing through a plate heat exchanger and exchanging heat with external cooling water in an ice thermal-storage auxiliary cooling apparatus flowing through the plate heat exchanger, wherein the internal cooling apparatus comprises an internal cooling circulation pump and an air cooler;
the ice thermal-storage auxiliary cooling apparatus comprises an external cooling circulation pump and an ice thermal-storage apparatus
wherein the method further comprises: opening a first loop valve and closing second loop valves, the air cooler and the device to be cooled forming a first loop in which the internal cooling water circulates; closing the first loop valve and opening the second loop valves, the device to be cooled, the air cooler and the plate heat exchanger forming a second loop in which the internal cooling water circulates; the plate heat exchanger and the ice thermal-storage apparatus forming a circulation loop for external cooling circulation water, and the external cooling water circulating in the circulation loop for the external cooling circulation water.

7. The method according to claim 6, wherein an environment temperature is compared with temperature thresholds $T_1$, $T_2$ and $T_3$, respectively, wherein the temperature threshold $T_1$ is determined depending on a design capacity of the air cooler (3), the temperature threshold $T_2$ is determined based on a design margin of the air cooler (3), the temperature threshold T3 is the highest extreme environment temperature, $T_1$ is less than $T_2$ and $T_2$ is less than $T_3$, when the environment temperature is lower than the temperature threshold $T_1$, the ice thermal-storage auxiliary cooling apparatus stops operation and the internal cooling water circulates in the first loop, wherein the internal cooling water is cooled when passing through the air cooler, and then is further used to cool the device to be cooled;
when the environment temperature is higher than $T_1$ and lower than the temperature threshold $T_2$, the first loop valve is closed and the second loop valves are opened, the internal cooling water circulates in the second loop, wherein the internal cooling water is cooled by the external cooling water when passing through the plate heat exchanger, and then is further used to cool the device to be cooled;
the ice thermal-storage apparatus operates and makes cooling-storage at night; when the environment temperature is higher than $T_2$ and lower than the temperature threshold $T_3$, the first loop valve is closed and the second loop valves are opened, the internal water circulates in the second loop, wherein the internal cooling water is cooled when passing through the air cooler, and then is further cooled by the external cooling water when passing through the plate heat exchanger, and the internal cooling water is used to cool the device to be cooled; the ice thermal-storage apparatus operates and makes cooling-storage at night.

8. The method according to claim 6, wherein opening and closing of the first loop valve and the second loop valves are controlled according to a water temperature of the internal cooling water and/or an environment temperature.

9. The method according to claim 6, wherein the internal cooling circulation pump and the external cooling circulation pump are in a primary-auxiliary redundancy configuration.

10. The method according to claim 6, wherein the device to be cooled is a converter valve provided in a DC power transmission equipment.

* * * * *

UNITED STATES PATENT AND TRADEMARK OFFICE
CERTIFICATE OF CORRECTION

PATENT NO. : 9,596,786 B2  
APPLICATION NO. : 14/361858  
DATED : March 14, 2017  
INVENTOR(S) : Ding et al.

Page 1 of 1

It is certified that error appears in the above-identified patent and that said Letters Patent is hereby corrected as shown below:

In the Claims

Column 9, Claim 5, Line 1: Delete "to claim 2" and insert -- to claim 1 --

Signed and Sealed this  
Thirteenth Day of March, 2018

Andrei Iancu  
*Director of the United States Patent and Trademark Office*